(12) United States Patent
Ping et al.

(10) Patent No.: US 9,877,127 B2
(45) Date of Patent: Jan. 23, 2018

(54) METHOD AND SYSTEM FOR TESTING TEMPERATURE TOLERANCE LIMIT OF LOUDSPEAKER

(71) Applicant: GOERTEK INC., Weifang (CN)

(72) Inventors: Kang Ping, Weifang (CN); Xinfeng Yang, Weifang (CN); Dong Qiu, Weifang (CN)

(73) Assignee: GOERTEK INC., Weifang (CN)

( * ) Notice: Subject to any disclaimer, the term of this patent is extended or adjusted under 35 U.S.C. 154(b) by 0 days.

(21) Appl. No.: 15/501,056

(22) PCT Filed: Dec. 7, 2015

(86) PCT No.: PCT/CN2015/096594
§ 371 (c)(1),
(2) Date: Feb. 1, 2017

(87) PCT Pub. No.: WO2016/192348
PCT Pub. Date: Dec. 8, 2016

(65) Prior Publication Data
US 2017/0257718 A1  Sep. 7, 2017

(30) Foreign Application Priority Data

Jun. 1, 2015  (CN) .......................... 2015 1 0292828

(51) Int. Cl.
*H04R 29/00* (2006.01)
*H04R 3/04* (2006.01)
*H03G 3/30* (2006.01)

(52) U.S. Cl.
CPC ......... *H04R 29/001* (2013.01); *H03G 3/3005* (2013.01); *H04R 3/04* (2013.01)

(58) Field of Classification Search
CPC ... H04R 9/02; H04R 3/00; H04R 3/04; H04R 29/001; H03G 9/5005
(Continued)

(56) References Cited

U.S. PATENT DOCUMENTS 8,817,995 B2  8/2014  Huijser et al.
9,173,020 B2  10/2015  Cheng et al.
(Continued)

FOREIGN PATENT DOCUMENTS

CN  101877807 A  11/2010
CN  102348147 A  2/2012
(Continued)

OTHER PUBLICATIONS

International Search Report (PCT/ISA/210) dated Mar. 4, 2016, by the State Intellectual Property Office of the P.R. China as the International Searching Authority for International Application No. PCT/CN2015/096594.
(Continued)

*Primary Examiner* — Melur Ramakrishnaiah
(74) *Attorney, Agent, or Firm* — Buchanan Ingersoll & Rooney PC

(57) ABSTRACT

A method and system for testing a temperature tolerance limit of a loudspeaker. The method includes: selecting a test signal, and determining a test output voltage as a rated voltage of the loudspeaker, so that the loudspeaker reaches a rated amplitude; determining a gain boosting frequency point according to a resonant frequency of the loudspeaker; performing a plurality of tests for the loudspeaker, and in each test controlling the test signal to maintain the gain constant in a frequency band lower than the gain boosting frequency point and increase the gain in a frequency band higher than the gain boosting frequency point, testing and recording a temperature of the loudspeaker till the loudspeaker fails, and recording a temperature at the time of the failure; and determining a highest temperature that is tolerable by the loudspeaker before the loudspeaker fails.

10 Claims, 3 Drawing Sheets

(58) Field of Classification Search
USPC .............................................. 381/59, 55, 58
See application file for complete search history.

(56) References Cited

U.S. PATENT DOCUMENTS

| | | |
|---|---|---|
| 9,510,101 B1 | 11/2016 | Polleros |
| 2010/0127771 A1 | 5/2010 | Sekiya |
| 2013/0077794 A1 | 3/2013 | Risbo et al. |
| 2014/0126730 A1 | 5/2014 | Crawley et al. |
| 2015/0146875 A1 | 5/2015 | Gautama |
| 2015/0215704 A1* | 7/2015 | Magrath ................ H04R 9/022 381/55 |

FOREIGN PATENT DOCUMENTS

| | | |
|---|---|---|
| CN | 103369447 A | 10/2013 |
| CN | 103813236 A | 5/2014 |
| CN | 103873985 A | 6/2014 |
| CN | 204157056 U | 2/2015 |
| CN | 104936122 A | 9/2015 |

OTHER PUBLICATIONS

Written Opinion (PCT/ISA/237) issued on Mar. 4, 2016, by the State Intellectual Property Office of the P.R. China as the International Searching Authority for International Application No. PCT/CN2015/096594.

Office Action (First Office Action) dated Aug. 1, 2017, by the State Intellectual Property Office of the People's Republic of China in corresponding Chinese Application No. 201510292828.3, and an English translation of the Office Action. (10 pages).

* cited by examiner

METHOD AND SYSTEM FOR TESTING TEMPERATURE TOLERANCE LIMIT OF LOUDSPEAKER

TECHNICAL FIELD

The present disclosure relates to the technical field of loudspeaker test, and particularly, to a method and system for testing a temperature tolerance limit of a loudspeaker.

BACKGROUND

In the mobile Internet era, consumer electronics are increasingly popular, and a lot of intelligent devices appear in people's daily lives. Under the tendency of lighting, thinning, and high power of the devices, as an indispensable part of many electronics, loudspeakers also face more challenges. The excess temperature of the loudspeaker is an important factor that causes the failure of the loudspeaker, and how to determine the reliability of the loudspeaker under high power is a problem to be urgently solved. The conventional test method is to place the loudspeaker into a heating box, select a test signal in a certain frequency band, and judge whether the loudspeaker fails after the test signal is input for a period. If after the period, the loudspeaker still works normally, the voltage of the test signal is increased in a gradient (e.g., increased by 0.5 v in each test) till the loudspeaker fails, and the failure temperature is recorded to determine the highest temperature value bearable by the loudspeaker before the failure.

It is clear that the conventional test method tests the highest temperature value bearable by the loudspeaker by increasing the temperature value of the heating box. The conventional test method determines the temperature tolerance limit of the loudspeaker in a very low efficiency, and the voltage of the test signal is increased at equal magnitudes in the full frequency band. Thus the temperature tolerance limit of the loudspeaker will be affected by the amplitude of the loudspeaker while heat is generated, and the test result will be interfered with. In addition, the conventional test method requires a professional temperature rising test device (e.g., a heating box), which obviously increases the test cost.

SUMMARY OF THE DISCLOSURE

The present disclosure provides a method and system for testing a temperature tolerance limit of a loudspeaker, so as to solve the problems that the existing test method is affected by the amplitude of the loudspeaker, the test result is interfered with, and the test cost is high.

In order to achieve the above objective, the present disclosure provides a method and system for testing a temperature tolerance limit of a loudspeaker. The method comprises:

selecting a test signal, and determining a test output voltage as a rated voltage of the loudspeaker, so that the loudspeaker reaches a rated amplitude;

determining a gain boosting frequency point for increasing a gain of the test signal, according to a resonant frequency of the loudspeaker;

performing a plurality of tests for the loudspeaker with a specific frequency sweep cycle, and in each test controlling the test signal to maintain the gain constant in a frequency band lower than the gain boosting frequency point and increase the gain in a frequency band higher than the gain boosting frequency point, testing and recording a temperature of the loudspeaker, controlling the loudspeaker to continuously run for a duration, judging whether the loudspeaker fails, and if the loudspeaker does not fail, continuing the test till the loudspeaker fails, and recording a temperature at the time of the failure; and determining a highest temperature that is tolerable by the loudspeaker before the loudspeaker fails according to the temperature at the time of the failure of the loudspeaker.

Optionally, the determining a gain boosting frequency point for increasing a gain of the test signal, according to a resonant frequency of the loudspeaker comprises:

determining the resonant frequency of the loudspeaker, and taking the resonant frequency of the loudspeaker plus a preset frequency as the gain boosting frequency point for increasing the gain of the test signal.

Optionally, the performing a plurality of tests for the loudspeaker, and in each test controlling the test signal to maintain the gain constant in a frequency band lower than the gain boosting frequency point and increase the gain in a frequency band higher than the gain boosting frequency point comprises:

in each test, gradually increasing the gain based on the previous gain in the frequency band higher than the gain boosting frequency point.

Optionally, the method comprises: selecting a sine swept-frequency signal of 100 to 20 kHz as the test signal.

Optionally, the method comprises: selecting any value between 2 to 10 seconds as a frequency sweep cycle.

Corresponding to the method for testing a temperature tolerance limit of a loudspeaker, the present disclosure further provides a system for testing a temperature tolerance limit of a loudspeaker, comprising:

a test output voltage determination unit configured to select a test signal, and determine a test output voltage as a rated voltage of the loudspeaker, so that the loudspeaker reaches a rated amplitude;

a gain boosting frequency point determination unit configured to determine a gain boosting frequency point for increasing a gain of the test signal, according to a resonant frequency of the loudspeaker;

a test unit configured to perform a plurality of tests for the loudspeaker with a specific frequency sweep cycle, and in each test control the test signal to maintain the gain constant in a frequency band lower than the gain boosting frequency point and increase the gain in a frequency band higher than the gain boosting frequency point, test and record a temperature of the loudspeaker, control the loudspeaker to continuously run for a duration, judge whether the loudspeaker fails, and if the loudspeaker does not fail, continue the test till the loudspeaker fails, and record a temperature at the time of the failure; and a highest temperature determination unit configured to determine a highest temperature that is tolerable by the loudspeaker before the loudspeaker fails according to the temperature at the time of the failure of the loudspeaker.

Optionally, the gain boosting frequency point determination unit is specifically configured to determine the resonant frequency of the loudspeaker, and take the resonant frequency of the loudspeaker plus a preset frequency as the gain boosting frequency point for increasing the gain of the test signal.

Optionally, the test unit is specifically configured to in each test, gradually increase the gain based on the previous gain in the frequency band higher than the gain boosting frequency point.

Optionally, the test signal is a sine swept-frequency signal of 100 to 20 kHz.

Optionally, the specific frequency sweep cycle is any value between 2 to 10 seconds.

The present disclosure achieves the following beneficial effects: the method and system for testing a temperature tolerance limit of a loudspeaker provided by the present disclosure firstly take a sine swept-frequency signal of 100 to 20 kHz as the test signal, and determine the output voltage as the rated voltage of the loudspeaker, so that the loudspeaker reaches a rated amplitude; next, determine a gain boosting frequency point for increasing a gain of the test signal, according to a resonant frequency of the loudspeaker, so as to prevent the gain from being increased at the resonant frequency of the loudspeaker; enable the loudspeaker itself to generate more heat by increasing the gain in the frequency band higher than the gain boosting frequency point, so as to raise the temperature of the loudspeaker and quickly determine the temperature limit that is tolerable by the loudspeaker. By maintaining the gain constant in the frequency band lower than the gain boosting frequency point, it ensures that the loudspeaker works at the normal amplitude, and avoids the adverse impact of an excessive amplitude of the loudspeaker on the test result. In addition, as compared with the conventional test method that raises the temperature by a heating box, the technical solutions provided by the present disclosure perform the temperature tolerance test by using the heat of the loudspeaker itself, without needing the test device such as the heating box, and saves the test cost.

The above descriptions are just generalizations of the technical solutions of the present disclosure, and in order to understand the technical means of the present disclosure more clearly, the specific embodiments of the present disclosure are illustrated as follows.

BRIEF DESCRIPTION OF THE DRAWINGS

The drawings are provided for a further understanding of the present disclosure, and constitute part of the Specification. The drawings are used together with the embodiments of the present disclosure to explain the present disclosure, rather than making any limitation to the present disclosure. In the drawings.

DETAILED DESCRIPTION

Figure 1:
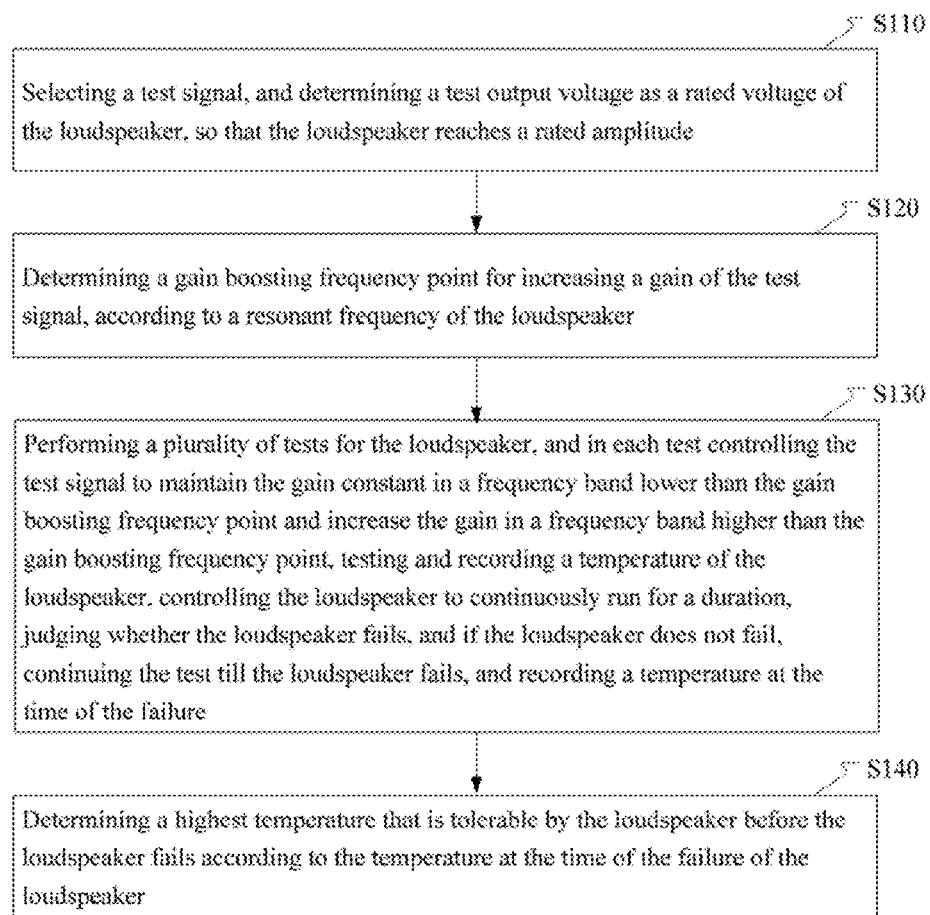
FIG. 1 is a flow diagram of a method for testing a temperature tolerance limit of a loudspeaker in one embodiment of the present disclosure.

The core idea of the present disclosure is that the excess temperature of the loudspeaker is an important factor that causes failure of the loudspeaker, and how to identify the reliability of the loudspeaker under high power is a problem to be urgently solved. The conventional method of identifying the reliability of the loudspeaker by testing the temperature thereof is limited in that the impact of the amplitude of the loudspeaker on the test result cannot be eliminated. When determining the temperature limit of the loudspeaker, the conventional test method uses a swept-frequency signal of 100 to 20 kHz as the test signal. However, when a test is carried out in the conventional test method, the gain is increased at equal magnitudes in the full frequency band, which causes an excessive amplitude of the loudspeaker at the resonant frequency, damages the loudspeaker, and affects the judgment of the temperature limit. It is difficult for the conventional test method to avoid the impact caused by the excessive amplitude of the loudspeaker, because the temperature tolerance limit of the loudspeaker is determined by generating more heat at the loudspeaker by increasing the voltage of the test signal at equal magnitudes in the range of 100 to 20 kHz. In the conventional test method, the magnitudes at respective frequency points in the frequency band of 100 to 20 kHz are equal to each other, while in the same frequency sweep cycle of 100 to 20 kHz, the loudspeaker has inconsistent amplitudes, and the largest amplitude of the loudspeaker is reached at the resonant frequency. At that time, if the increase of the amplitude of the test signal is continued, the amplitude of the loudspeaker becomes very large, even exceeding the vibration space and causing wire breaking, and finally leads to a failed test. The difficulty in improving the prior art is how to avoid the impact caused by the amplitude of the loudspeaker when the temperature tolerance limit of the loudspeaker is to be tested. In addition, the conventional test method usually places the loudspeaker into the heating box, and then tests the temperature tolerance limit of the loudspeaker by raising the temperature of the heating box. This test method increases the test cost.

In view of the above problems, the present disclosure proposes a test solution using the variable gain of the signal. The test signal is still a swept-frequency signal of 100 to 20 kHz, but the difference is that in the embodiments of the present disclosure, the gain of the test signal does not vary at equal magnitudes in the full frequency band, and the gain variations before and after a gain boosting frequency point determined from the resonant frequency of the loudspeaker are different from each other, i.e., the gain of the test signal in the frequency band higher than the gain boosting frequency point is larger than the gain in the frequency band before the gain boosting frequency point, which ensures the loudspeaker to generate more heat in the high frequency band of the test signal while preventing the amplitude of the loudspeaker from exceeding the safety space at the resonant frequency and causing a failure, so as to quickly determine the temperature tolerance limit of the loudspeaker. Meanwhile, the present disclosure carries out the test by adjusting the loudspeaker to the rated amplitude of normal operation, and generates heat by the loudspeaker itself, without needing a special temperature raising device such as the heating box, which also saves the test cost.

FIG. 1 is a flow diagram of a method for testing a temperature tolerance limit of a loudspeaker in one embodiment of the present disclosure. Referring to FIG. 1, a method for testing a temperature tolerance limit of a loudspeaker in one embodiment of the present disclosure comprises:

step S110: selecting a test signal, and determining a test output voltage as a rated voltage of the loudspeaker, so that the loudspeaker reaches a rated amplitude;

step S120: determining a gain boosting frequency point for increasing a gain of the test signal, according to a resonant frequency of the loudspeaker;

step S130: performing a plurality of tests for the loudspeaker with a specific frequency sweep cycle, and in each test controlling the test signal to maintain the gain constant in a frequency band lower than the gain boosting frequency point and increase the gain in a frequency band higher than the gain boosting frequency point, testing and recording a temperature of the loudspeaker, controlling the loudspeaker to continuously run for a duration, judging whether the loudspeaker fails, and if the loudspeaker does not fail, continuing the test till the loudspeaker fails, and recording a temperature at the time of the failure;

step S140: determining a highest temperature that is tolerable by the loudspeaker before the loudspeaker fails according to the temperature at the time of the failure of the loudspeaker.

Through those steps illustrated in FIG. 1, the method for testing a temperature tolerance limit of a loudspeaker in the present disclosure does not increase the gain of the test signal in a frequency band lower than or equal to the gain boosting frequency point, and increases the gain in a frequency band higher than the gain boosting frequency point, so as to prevent the amplitude of the loudspeaker from exceeding the safety space at the resonant frequency and causing a failure, and eliminate the impact of the amplitude of the loudspeaker on the test result. In addition, more heat is generated by the loudspeaker by increasing the gain of the test signal in the high frequency band, and the temperature tolerance limit of the loudspeaker can be determined conveniently and quickly.

In one embodiment of the present disclosure, step S110 comprises: determining the resonant frequency of the loudspeaker, and taking the resonant frequency of the loudspeaker plus a preset frequency such as 500 Hz as the gain boosting frequency point for increasing the gain of the test signal.

In one embodiment of the present disclosure, the increasing the gain in a frequency band higher than the gain boosting frequency point in step S130 comprises: in each test, gradually increasing the gain based on the previous gain in the frequency band of the test signal higher than the gain boosting frequency point. In practice, the method may perform a plurality of tests for the loudspeaker, and the gain of the test signal may be increased by a different magnitude each time. For example, the gain of the test signal may be increased by 1 dB at the first time of test, and the temperature after the gain is increased by 1 dB may be tested and recorded. The performance of the loudspeaker is tested at the above temperature, i.e., the loudspeaker is continuously run for a duration (e.g., 96 hours) and then observed. At that time, if the loudspeaker does not fail, the test will be made again, and the gain of the test signal may be increased by 3 dB or 1 dB to observe whether the loudspeaker fails. The test is repeated in this way till the loudspeaker fails. The maximum one among the plurality of temperature values obtained in the tests before the loudspeaker fails will be determined as the temperature tolerance limit of the loudspeaker.

Figure 2A:
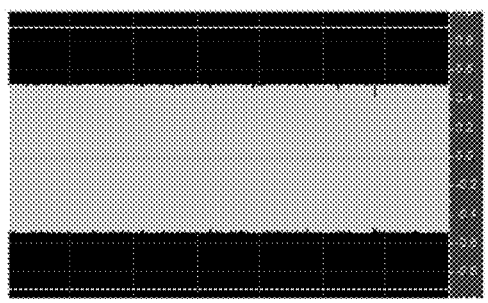
FIGS. 2a and 2b are schematic diagrams of a comparison between amplitudes before and after the gain of the test signal is increased in a conventional test method.
Figure 2B:
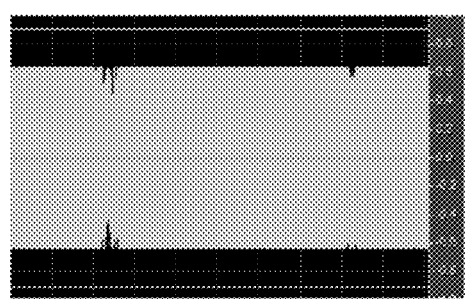
Figures 3A, 3B:
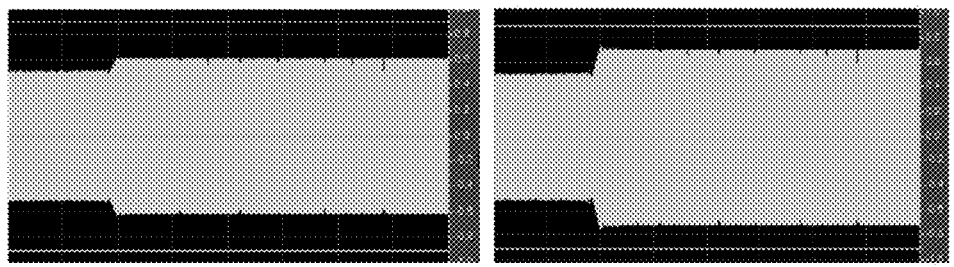
FIGS. 3a and 3b are schematic diagrams of a comparison between amplitudes before and after the gain of the test signal is increased in a method for testing a temperature tolerance limit of a loudspeaker in one embodiment of the present disclosure.

FIGS. 2a and 2b are schematic diagrams of a comparison between amplitudes before and after the gain of the test signal is increased in a conventional test method. FIGS. 3a and 3b are schematic diagrams of a comparison between amplitudes before and after the gain of the test signal is increased in a method for testing a temperature tolerance limit of a loudspeaker in one embodiment of the present disclosure. Next, the beneficial effects of the method for testing a temperature tolerance limit of a loudspeaker of the present disclosure will be described in details with reference to FIGS. 2a, 2b, 3a, and 3b, by comparing the conventional test method and the test method of the present disclosure. FIG. 2a is a schematic diagram before the gain of the test signal is increased in the conventional test method, and FIG. 2b is a schematic diagram after the gain of the test signal is increased in the conventional test method. As can be seen from the comparison between FIGS. 2a and 2b, conventionally the gain of the test signal is increased at equal magnitudes in the full frequency band.

To be noted, FIGS. 2a and 2b take a certain frequency band in the test signal to schematically illustrate that conventionally the gain of the test signal is increased in the full frequency band, and the increase magnitudes at respective frequency points are the same.

FIG. 3a is a schematic diagram before the gain of the test signal is increased in one embodiment of the present disclosure, and FIG. 3b is a schematic diagram after the gain of the test signal is increased in one embodiment of the present disclosure. As can be seen from the comparison between FIGS. 3a and 3b, in the method for testing a temperature tolerance limit of a loudspeaker in the present disclosure, the gain of the test signal is maintained constant in a frequency band before the gain boosting frequency point, and only increased in a frequency band after the gain boosting frequency point. In that, when the gain boosting frequency point for the test signal is to be determined, the resonant frequency of the loudspeaker should be considered, and the resonant frequency plus 500 Hz is taken as the gain boosting frequency point for increasing the gain of the test signal, which prevents the gain of the test signal from being increased before or at the resonant frequency to cause a failure of the loudspeaker, and then affecting the test result.

To be noted, FIGS. 3a and 3b take a certain frequency band in the test signal to schematically illustrate that, the gain of the test signal in the conventional test method is increased in the full frequency band, and the increase magnitudes at the frequency points in two frequency bands are different from each other.

Figure 4:
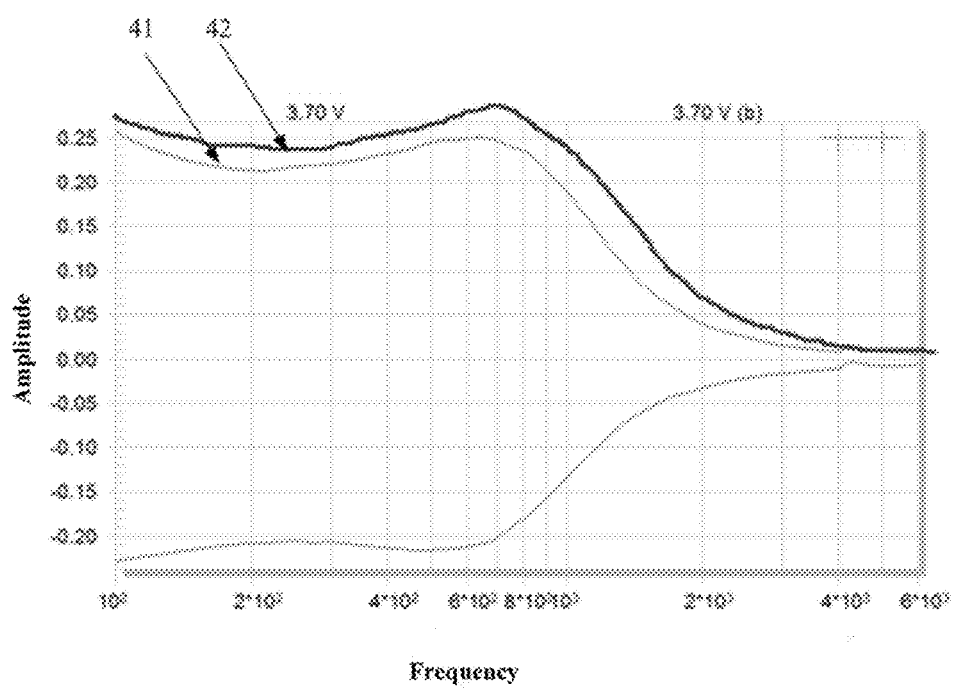
FIG. 4 is a schematic diagram of variations of an initial amplitude of a loudspeaker and the amplitude of the loudspeaker after a test signal is applied in the conventional test method.
Figure 5:
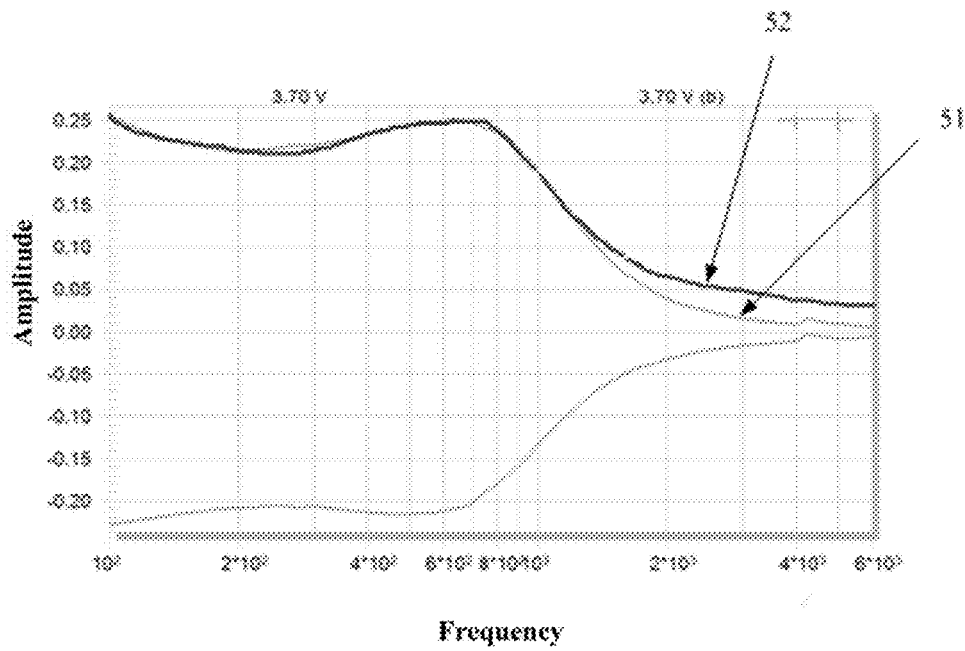
FIG. 5 is a schematic diagram of variations of an initial amplitude of a loudspeaker and the amplitude of the loudspeaker after a test signal is applied in a method for testing a temperature tolerance limit of a loudspeaker in one embodiment of the present disclosure.

FIG. 4 is a schematic diagram of variations of an initial amplitude of a loudspeaker and the amplitude of the loudspeaker after a test signal is applied in the conventional test method. FIG. 5 is a schematic diagram of variations of an initial amplitude of a loudspeaker and the amplitude of the loudspeaker after a test signal is applied in a method for testing a temperature tolerance limit of a loudspeaker in one embodiment of the present disclosure. Next, the method for testing a temperature tolerance limit of a loudspeaker in the present disclosure will be described in details with reference to FIGS. 4 and 5, by comparing the conventional test method with the method for testing a temperature tolerance limit of a loudspeaker in the present disclosure.

In FIG. 4, curve 41 indicates the amplitude of the loudspeaker at a rated voltage, and curve 42 indicates the amplitude of the loudspeaker at 100 to 20 kHz after a whole increase of the gain of the test signal by 1 dB. It can be seen that the amplitude of the loudspeaker has been very large at the resonant frequency (e.g., 700 Hz in FIG. 4). Thus after a continuous running of 96 hours to test the performance of the loudspeaker, the amplitude of the loudspeaker will quite probably exceed the safe amplitude, which causes wire breaking and failure of the loudspeaker. Referring to FIG. 4, the resonant frequency of the loudspeaker is about 700 Hz, i.e., the amplitude of the loudspeaker reaches the maximum value at 700 Hz. In the conventional method for testing a temperature tolerance limit of a loudspeaker, the signal amplitude is increased at equal magnitudes in the full frequency band of 100 to 20 KHz. At a frequency larger than or equal to the resonant frequency of the loudspeaker, when the signal amplitude is increased, the amplitude of the loudspeaker will exceed the safety space (at 700 Hz, the amplitude of the loudspeaker exceeds the amplitude safety value of 0.25 mm and will cause wire breaking) to cause wire breaking and failure of the loudspeaker, and affect the test result. However, in the technical solution of the present disclosure, the gain boosting frequency point is determined when the rated amplitude of the loudspeaker is given, so as to ensure that the gain of the test signal is maintained constant in a frequency band lower than the gain boosting frequency point, and avoid the adverse impact from the amplitude of the loudspeaker on the test result.

Referring to FIG. 5, curve 51 indicates the rated amplitude of the loudspeaker at a rated voltage, and curve 52 indicates the amplitude of the loudspeaker at 100 to 20 kHz after the gain of the test signal is increased by 1 dB in the frequency band higher than the gain boosting frequency point. In this embodiment, the resonant frequency of the loudspeaker is about 700 Hz, i.e., the amplitude of the loudspeaker reaches the maximum value at 700 Hz. In the method for testing a temperature tolerance limit of a loudspeaker in the present disclosure, the signal amplitude is not increased at equal magnitudes in the full frequency band of 100 to 20 KHz. In this embodiment, the resonant frequency 700 Hz plus 500 Hz, i.e., 1200 Hz, is taken as the gain boosting frequency point. The gain of the test signal is increased from the gain boosting frequency point of 1200 Hz, and maintained constant before the gain boosting frequency point of 1200 Hz. As can be seen from FIG. 5, before 1200 Hz, the curve of the amplitude of the loudspeaker applied with the test signal is substantially consistent with the curve of the initial amplitude of the loudspeaker. After 1200 Hz, the gain begins to be increased, the amplitude of the loudspeaker applied with the test signal rises, and more heat is generated by the loudspeaker in the high frequency band of the test signal since the gain of the test signal is increased, thereby determining a highest temperature that is tolerable by the loudspeaker before the loudspeaker fails, and making the test more accurate and reasonable.

To be noted, the embodiment of the present disclosure takes 1200 Hz as the gain boosting frequency point for increasing the gain of the test spinal. In other embodiments of the present disclosure, other different frequencies may also be selected as the gain boosting frequency point depending on different resonant frequencies of the loudspeaker. For example, 3000 Hz and 4000 Hz may be selected as the gain boosting frequency point for increasing the gain of the test signal, which is not limited herein, provided that the gain boosting frequency point for increasing the gain of the test signal is located after the resonant frequency of the loudspeaker to avoid the test result being affected since a failure may be caused by the excessive amplitude of the loudspeaker.

In one embodiment of the present disclosure, the frequency sweep cycle may be any value between 2 to 10 seconds. To be noted, factors such as the power of the loudspeaker and the frequency band of the test signal should be considered for the selection of the frequency sweep cycle. If the frequency sweep cycle is too long, it is adverse to temperature centralization, and there may be certain errors between the obtained test result and the actual tolerable temperature value of the loudspeaker. Thus in practice, 3 or 4 seconds may be selected as a frequency sweep cycle.

In addition, corresponding to the method for testing a temperature tolerance limit of a loudspeaker, the present disclosure further provides a system for testing a temperature tolerance limit of a loudspeaker.

Figure 6:
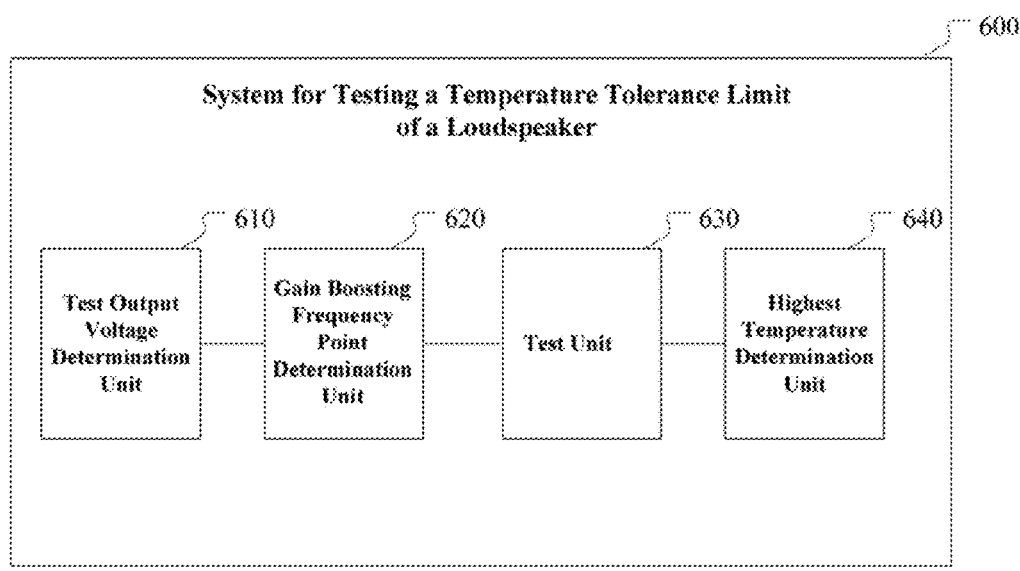
FIG. 6 is a block diagram of a system for testing a temperature tolerance limit of a loudspeaker in one embodiment of the present disclosure.

FIG. 6 is a block diagram of a system for testing a temperature tolerance limit of a loudspeaker in one embodiment of the present disclosure. Referring to FIG. 6, the system 600 for testing a temperature tolerance limit of a loudspeaker comprises:

a test output voltage determination unit 610 configured to select a test signal, and determine a test output voltage as a rated voltage of the loudspeaker, so that the loudspeaker reaches a rated amplitude;

a gain boosting frequency point determination unit 620 configured to determine a gain boosting frequency point for increasing a gain of the test signal, according to a resonant frequency of the loudspeaker;

a test unit 630 configured to perform a plurality of tests for the loudspeaker with a specific frequency sweep cycle, and in each test control the test signal to maintain the gain constant in a frequency band lower than the gain boosting frequency point and increase the gain in a frequency band higher than the gain boosting frequency point, test and record a temperature of the loudspeaker, control the loudspeaker to continuously run for a duration, judge whether the loudspeaker fails, and if the loudspeaker does not fail, continue the test till the loudspeaker fails, and record a temperature at the time of the failure; and a highest temperature determination unit 640 configured to determine a highest temperature that is tolerable by the loudspeaker before the loudspeaker fails according to the temperature at the time of the failure of the loudspeaker.

In one embodiment of the present disclosure, the gain boosting frequency point determination unit 610 is specifically configured to determine the resonant frequency of the loudspeaker, and take the resonant frequency of the loudspeaker plus a preset frequency such as 500 Hz as the gain boosting frequency point for increasing the gain of the test signal.

In one embodiment of the present disclosure, the test unit 620 is specifically configured to in each test, gradually increase the gain based on the previous gain in the frequency band higher than the gain boosting frequency point.

In one embodiment of the present disclosure, the test signal is a sine swept-frequency signal of 100 to 20 kHz.

In one embodiment of the present disclosure, the specific frequency sweep cycle is any value between 2 to 10 seconds.

To be noted, the system for testing a temperature tolerance limit of a loudspeaker in the present disclosure is corresponding to the method for testing a temperature tolerance limit of a loudspeaker. Thus please refer to the detailed descriptions of the method for testing a temperature tolerance limit of a loudspeaker for the working process of the system for testing a temperature tolerance limit of a loudspeaker in this embodiment, which is omitted herein.

In conclusion, the method and system for testing a temperature tolerance limit of a loudspeaker provided by the present disclosure enable the loudspeaker to generate more heat by increasing the gain in the frequency band higher than the gain boosting frequency point, so as to raise the temperature of the loudspeaker and determine the temperature tolerance limit of the loudspeaker. By maintaining the gain of the test signal constant in the frequency band lower than the gain boosting frequency point, it ensures that the loudspeaker works at the normal amplitude, and avoids the impact of an excessive amplitude on the test result. In addition, as compared with the conventional test method that raises the temperature by a heating box, the test method of the present disclosure performs the temperature tolerance test by using the heat of the loudspeaker itself, without needing the test device such as the heating box, and saves the test cost.

The above descriptions are just preferred embodiments of the present disclosure, rather than limitations to the protection scope of the present disclosure. Any amendment, equivalent replacement, improvement, etc. made within the spirit and principle of the present disclosure shall fall within the protection scope of the present disclosure.

The invention claimed is:

1. A method for testing a temperature tolerance limit of a loudspeaker, comprising:
    selecting a test signal, and determining a test output voltage as a rated voltage of the loudspeaker, so that the loudspeaker reaches a rated amplitude;
    determining a gain boosting frequency point for increasing a gain of the test signal, according to a resonant frequency of the loudspeaker;
    performing a plurality of tests for the loudspeaker with a specific frequency sweep cycle, and in each test controlling the test signal to maintain the gain constant in a frequency band lower than the gain boosting frequency point and increase the gain in a frequency band higher than the gain boosting frequency point, testing and recording a temperature of the loudspeaker, controlling the loudspeaker to continuously run for a duration, judging whether the loudspeaker fails, and if the loudspeaker does not fail, continuing the test till the loudspeaker fails, and recording a temperature at the time of the failure; and
    determining a highest temperature that is tolerable by the loudspeaker before the loudspeaker fails according to the temperature at the time of the failure of the loudspeaker.

2. The method for testing a temperature tolerance limit of a loudspeaker according to claim 1, wherein the determining a gain boosting frequency point for increasing a gain of the test signal, according to a resonant frequency of the loudspeaker comprises:
    determining the resonant frequency of the loudspeaker, and taking the resonant frequency of the loudspeaker plus a preset frequency as the gain boosting frequency point for increasing the gain of the test signal.

3. The method for testing a temperature tolerance limit of a loudspeaker according to claim 2, wherein the performing a plurality of tests for the loudspeaker, and in each test controlling the test signal to maintain the gain constant in a frequency band lower than the gain boosting frequency point and increase the gain in a frequency band higher than the gain boosting frequency point comprises:
    in each test, gradually increasing the gain based on the previous gain in the frequency band higher than the gain boosting frequency point.

4. The method for testing a temperature tolerance limit of a loudspeaker according to claim 1, comprising:
    selecting a sine swept-frequency signal of 100 to 20 kHz as the test signal.

5. The method for testing a temperature tolerance limit of a loudspeaker according to claim 4, comprising: selecting any value between 2 to 10 seconds as a frequency sweep cycle.

6. A system for testing a temperature tolerance limit of a loudspeaker, comprising:
    a test output voltage determination unit configured to select a test signal, and determine a test output voltage as a rated voltage of the loudspeaker, so that the loudspeaker reaches a rated amplitude;
    a gain boosting frequency point determination unit configured to determine a gain boosting frequency point for increasing a gain of the test signal, according to a resonant frequency of the loudspeaker;
    a test unit configured to perform a plurality of tests for the loudspeaker with a specific frequency sweep cycle, and in each test control the test signal to maintain the gain constant in a frequency band lower than the gain boosting frequency point and increase the gain in a frequency band higher than the gain boosting frequency point, test and record a temperature of the loudspeaker, control the loudspeaker to continuously run for a duration, judge whether the loudspeaker fails, and if the loudspeaker does not fail, continue the test till the loudspeaker fails, and record a temperature at the time of the failure; and
    a highest temperature determination unit configured to determine a highest temperature that is tolerable by the loudspeaker before the loudspeaker fails according to the temperature at the time of the failure of the loudspeaker.

7. The system for testing a temperature tolerance limit of a loudspeaker according to claim 6, wherein the gain boosting frequency point determination unit is specifically configured to determine the resonant frequency of the loudspeaker, and take the resonant frequency of the loudspeaker plus a preset frequency as the gain boosting frequency point for increasing the gain of the test signal.

8. The system for testing a temperature tolerance limit of a loudspeaker according to claim 7, wherein the test unit is specifically configured to in each test, gradually increase the gain based on the previous gain in the frequency band higher than the gain boosting frequency point.

9. The system for testing a temperature tolerance limit of a loudspeaker according to claim 6, wherein the test signal is a sine swept-frequency signal of 100 to 20 kHz.

10. The system for testing a temperature tolerance limit of a loudspeaker according to claim 6, wherein the specific frequency sweep cycle is any value between 2 to 10 seconds.

* * * * *